United States Patent
Boyan et al.

(10) Patent No.: US 7,107,165 B2
(45) Date of Patent: Sep. 12, 2006

(54) MARKERS USED IN THE CALCULATION AND DISPLAY OF BAND FUNCTIONS

(75) Inventors: Corydon Joseph Boyan, Santa Rosa, CA (US); Michael Ferrel, Santa Rosa, CA (US); Robert Nathan Nelson, Santa Rosa, CA (US); Joseph Michael Gorin, Santa Rosa, CA (US)

(73) Assignee: Agilent Technologies, Inc., Palo Alto, CA (US)

(*) Notice: Subject to any disclaimer, the term of this patent is extended or adjusted under 35 U.S.C. 154(b) by 84 days.

(21) Appl. No.: 10/718,124

(22) Filed: Nov. 19, 2003

(65) Prior Publication Data

US 2005/0104906 A1 May 19, 2005

(51) Int. Cl.
*G06F 19/00* (2006.01)

(52) U.S. Cl. .................................................. 702/75

(58) Field of Classification Search .............. 702/75, 702/12, 6; 367/99; 324/76, 636, 77; 361/298; 600/407, 409, 458; 333/1; 343/702; 701/23
See application file for complete search history.

(56) References Cited

U.S. PATENT DOCUMENTS 4,132,945 A * 1/1979 Cunningham ............. 324/636
5,075,618 A * 12/1991 Katayama ................. 324/76.27
5,617,523 A * 4/1997 Imazu et al. .............. 345/440

OTHER PUBLICATIONS

Merriam-Webster's dictionary Tenth edition, 1993., p. 929.*
*Measurement Guide and Programming Examples, Agilent Technologies PSA Series Spectrum Analyzers*, Agilent Technologies Manufacturing Part No. E4440-90063, May 2002, Available from Agilent Technologies, Inc., www.Agilent.com., pp. 1-72.
*Agilent Spectrum Analyzer Measurements and Noise, Application Note 1303*, Agilent Technologies Manufacturing Part No. 5966-4008E, Feb. 11, 2003, Available from Agilent Technologies, Inc., www.Agilent.com.

* cited by examiner

*Primary Examiner*—Bryan Bui
*Assistant Examiner*—Tung S. Lau

(57) ABSTRACT

A user interface for an electronic instrument includes a display that displays a signal and a band marker. The band marker demarks a bandwidth of the signal by marking both a start frequency of the bandwidth and a stop frequency of the bandwidth. The electronic instrument performs a function on the bandwidth of the signal between the start frequency and the stop frequency.

16 Claims, 5 Drawing Sheets

MARKERS USED IN THE CALCULATION AND DISPLAY OF BAND FUNCTIONS

BACKGROUND

The present invention concerns display of signals by testing devices and pertains particularly to markers used in the calculation and display of band functions.

When using a Spectrum analyzer, it is sometimes desirable to measure power or power density within a particular frequency range. This has been accomplished, for example, by using two separate markers to define each edge of the band of interest. Once a band is marked out, the power within the band can be calculated. See, for example, *Measurement Guide and Programming Examples, Agilent Technologies PSA Series Spectrum Analyzers*, May 2002, Manufacturing Part Number: E4440-90063, available from Agilent Technologies, Inc., www.agilent.com.

In addition to band power, it is also desirable to measure marker noise. In the past marker noise measurement has been done with a fixed width that is not indicated to a user nor under user control.

SUMMARY OF THE INVENTION

A user interface for an electronic instrument includes a display that displays a signal and a band marker. The band marker demarks a bandwidth of the signal by marking both a start frequency of the bandwidth and a stop frequency of the bandwidth. The electronic instrument performs a function on the bandwidth of the signal between the start frequency and the stop frequency.

DESCRIPTION OF THE PREFERRED EMBODIMENT

Figure 1:
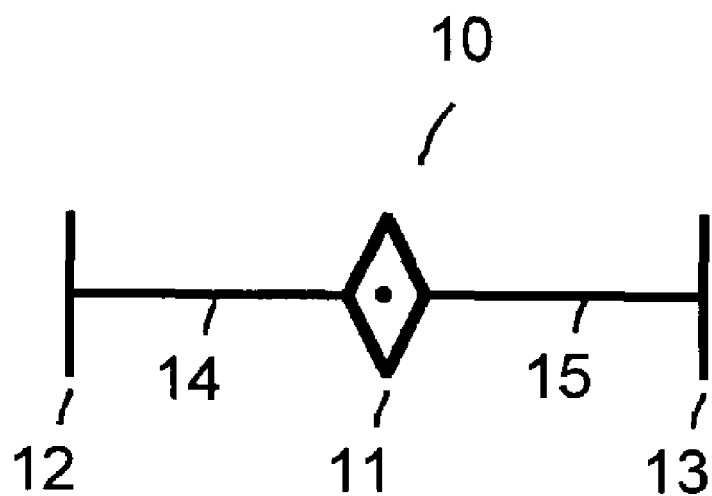
FIG. 1 shows a band marker in accordance with an embodiment of the present invention.

FIG. 1 shows a band marker 10. Band marker 10 is used to display and calculate band functions and their mathematical relationships.

A marker is a symbol placed at a particular data point in a frequency spectrum or time interval and used to accurately measure the amplitude of the data at that point in the spectrum or time interval.

A band marker has a width, allowing the band marker to easily demarcate a signal range, for example a frequency bandwidth. This allows for efficient demarcation of a range of a signal on which can be performed a mathematical operation. A mathematical operation performed on a bandwidth of a signal demarcated by a band marker is called a band function.

For example, as shown in FIG. 1, band marker 10 has a band center, represented in FIG. 1 as a diamond 11. A wing 14 and wing 15 are horizontal lines that extend out from either side of diamond 11 to indicate the width of band marker 10. A foot 12 and a foot 13 are vertical lines at the end of wing 14 and wing 15, respectively. Foot 12 demarcates the right edge of a signal band. Foot 13 demarcates the left edge of the signal band. A dot can optionally be placed in the center of diamond 11 to aid in locating the exact band center. In other embodiments other shapes can be used as band markers provided the edges of the signal band, and preferably the band center, are demarcated.

In various embodiments of the present invention, a user is allowed to control the placement of band center 11 and the width of band marker 10 through, for example, front panel keys of an instrument. Alternatively, the placement of band center 11 and the width of band marker 10 can be accomplished through a front panel knob, programming commands sent from a computer through a remote interface, or any other known user interface.

Band markers are useful for selecting a range of signals on which is performed mathematical operations (called band functions) such as band power and band power density. Band power represents the total amount of power of a signal within a selected frequency band. Band density represents the density of power of a signal within a selected frequency band.

Multiple band markers can be used to select multiple ranges of signals, allowing calculations to be made using multiple band functions. When relative mathematical calculations are made based on a ratio (difference on a decibel scale) of two band functions, the relative mathematical calculations are called delta band functions. Such use of multiple functions gives a user broad and extraordinary capability to define and execute sophisticated mathematical operations which are applicable to a wide range of measurement scenarios. For example, deltas can be calculated between normal markers, noise markers, band power markers and/or band density markers. In addition band functions can be placed on different traces and delta band functions can be calculated on band functions placed on different traces. Band functions can also be placed on stored traces.

Figure 2:
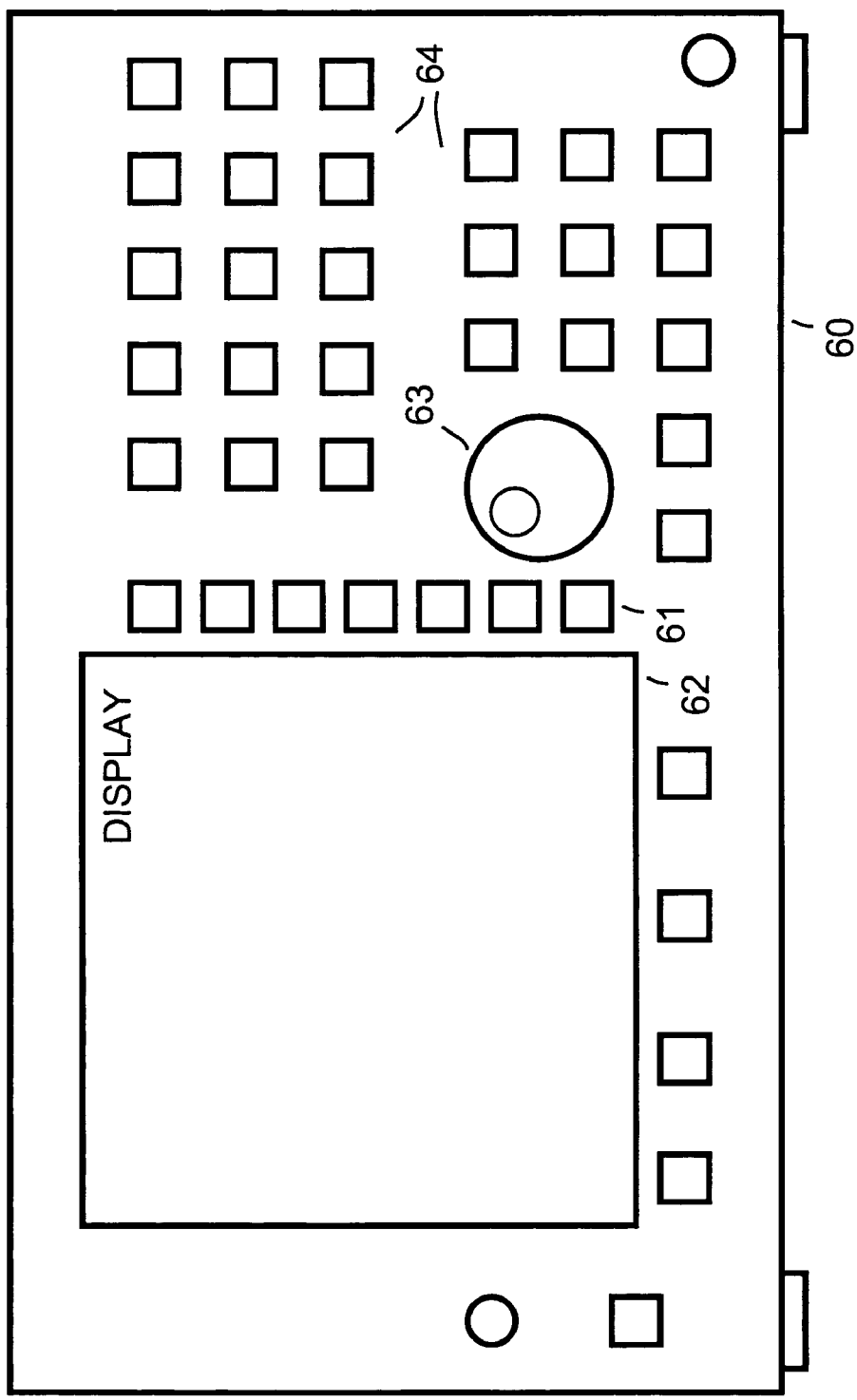
FIG. 2 shows a simplified view of a Spectrum Analyzer.

FIG. 2 shows a simplified view of a spectrum analyzer 60. Spectrum analyzer includes a display 62 and various buttons 64 used to receive input from a user. Spectrum analyzer 60 also includes an adjustment knob 63 and a column 61 of buttons used that correspond to softkeys shown on display 62.

Figure 3:
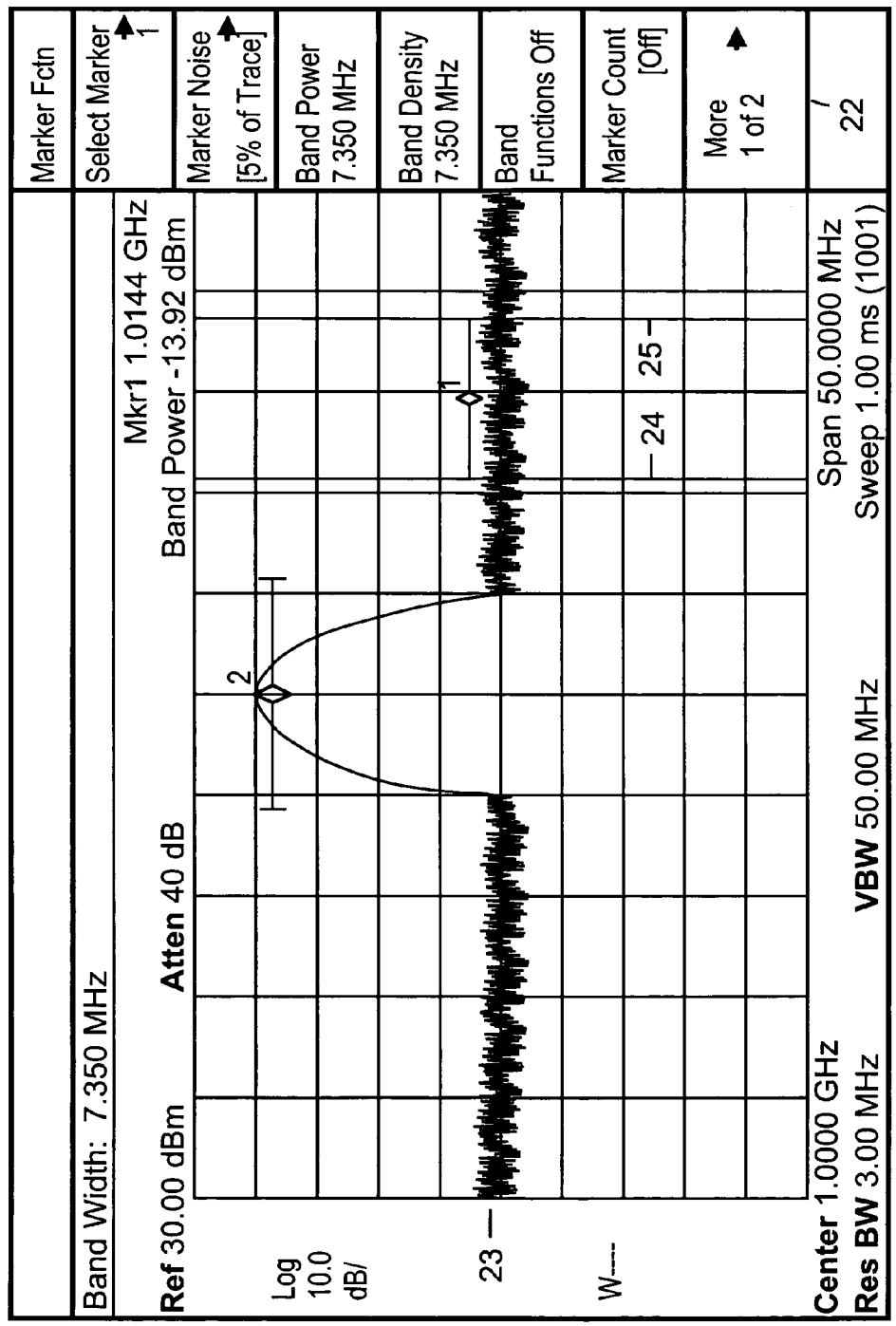
FIG. 3, FIG. 4 and FIG. 5 show screen displays with two band markers being used to select frequency bands of a displayed signal in accordance with embodiments of the present invention.

FIG. 3 shows a signal 23 being shown on display 62. Also shown are a column 22 of seven softkeys. A user has used a band marker 1 to demark a first bandwidth of signal 23 and has used a band marker 2 to demark a second bandwidth of signal 23. In this case, the first bandwidth and the second bandwidth are each a frequency range within signal 23.

In FIG. 3, band marker 1 has been selected along with the band power function. Since band marker 1 is selected, band marker 1 has been altered so that left foot 24 and right foot 25 extend the full height of the graticule on which signal 23 is displayed. Display 62 indicates that band marker 1 (Mkr1) has a center point at 1.0144 gigahertz (GHz). The bandwidth demarked by band marker 1 has been adjusted to 7.350 megahertz (MHz). Display 62 also indicates that band power for the bandwidth of signal 23 demarked by band marker 1 is −13.92 decibels referred to 1 milliwatt (dBm). Various portions of display 62 can be highlighted in different colors for easy readability.

FIG. 4 again shows signal 23 being shown on display 62. Also shown are column 22 of seven softkeys. Band marker 1 and band marker 2 are also shown at the same locations on signal 23.

Figure 4:
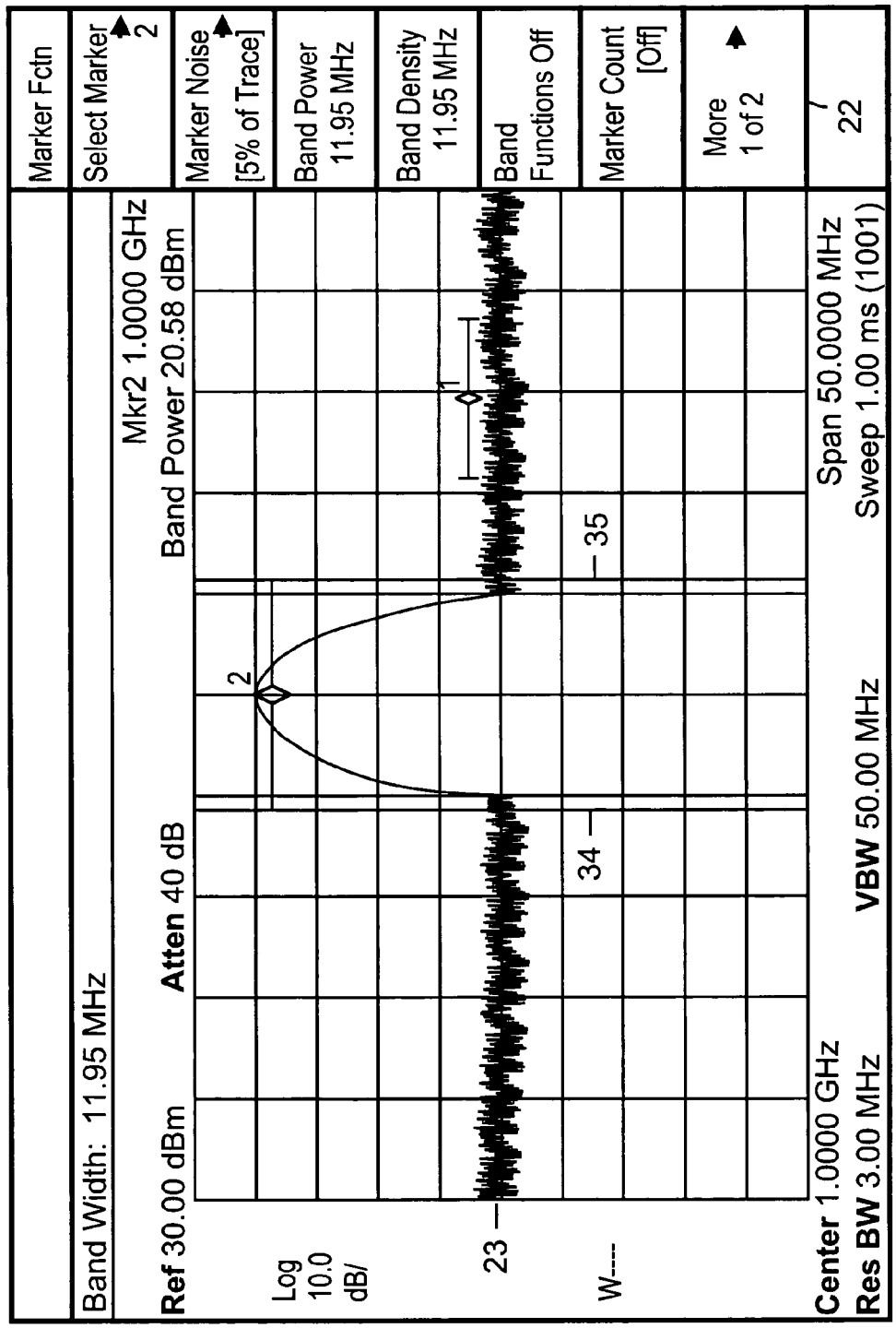

In FIG. 4, band marker 2 has been selected along with the band power function. Since band marker 2 is selected, band marker 2 has been altered so that left foot 34 and right foot 35 extend the full height of the graticule on which signal 23 is displayed. Display 62 indicates that band marker 2 (Mkr2) has a center point at 1.000 GHz. The bandwidth demarked by band marker 2 is at 11.95 MHz. Display 62 also indicates that band power for the bandwidth of signal 23 demarked by band marker 2 is 20.58 dBm.

FIG. 5 again shows signal 23 being shown on display 62. Also shown are column 22 of seven softkeys. Band marker 1 (renamed 1 Δ 2) and band marker 2 are also shown at the same locations on signal 23. "1 Δ 2" means "band marker 1, delta marker to band marker 2".

Figure 5:
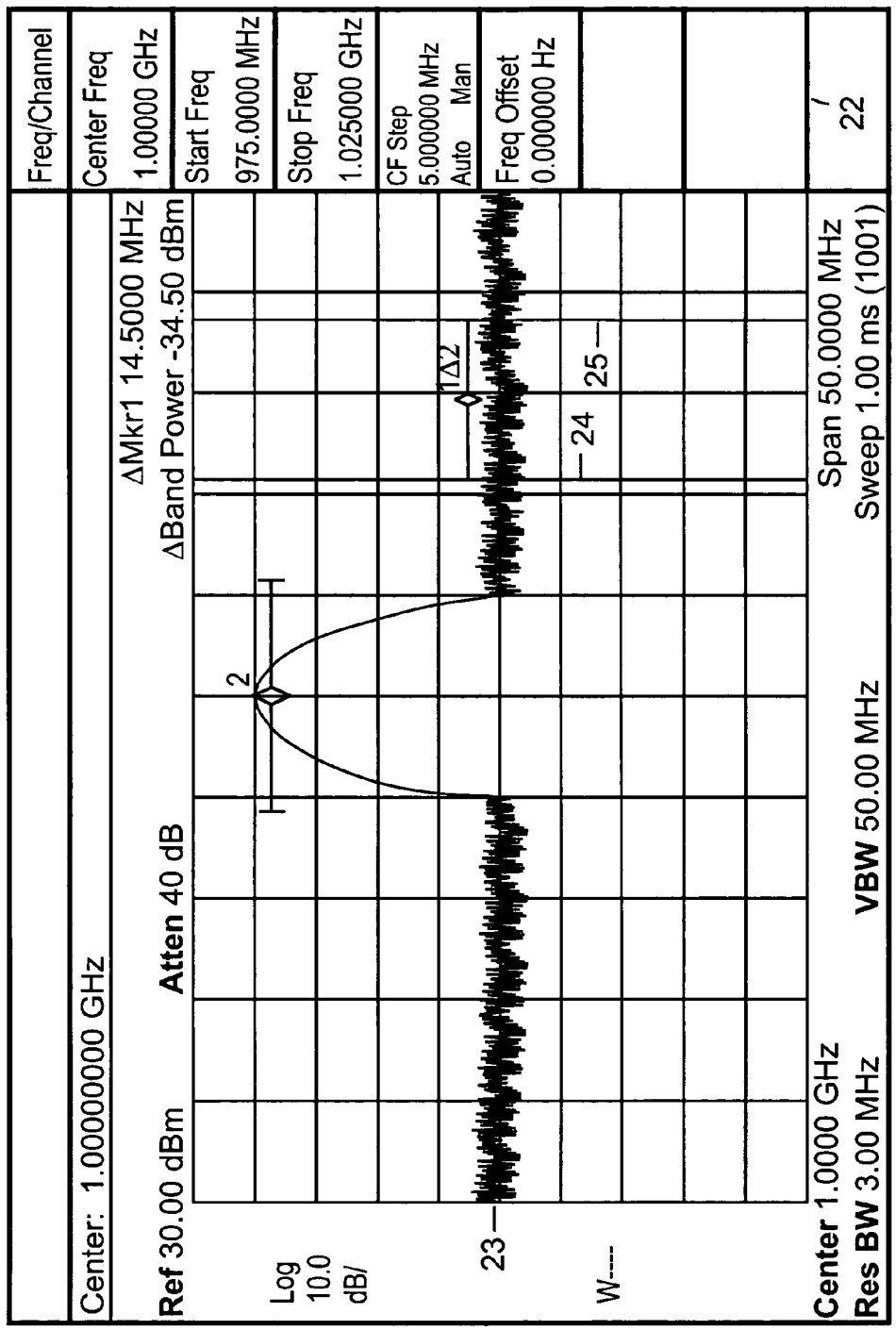

In FIG. 5, the log difference function has been selected. Log difference is a ratio of band power for the bandwidth of signal 23 demarked by band marker 1 (renamed 1 Δ 2) to band power for the bandwidth of signal 23 demarked by band marker 2. Since band marker 1 is selected and renamed 1 Δ 2, this indicates that band marker 2 is the reference marker and the band power (20.58 dBm) for the bandwidth of signal 23 demarked by band marker 2 is subtracted from the band power (−13.92 dBm) for the bandwidth of signal 23 demarked by band marker 1 (renamed 1 Δ 2).

While band functions and delta band functions have been illustrated using band power, other band functions and delta band functions, such as band power density and delta band density operate in a similar manner. Band power density is calculated by normalizing the power over the bandwidth.

For example, power within a frequency, called the channel bandwidth, can be calculated as set out in Equation 1:

$$P_{ch} = \left(\frac{B_s}{B_n}\right)\left(\frac{1}{N}\right)\sum_{i=n1}^{n2} 10^{(p_i/10)} \quad \text{Equation 1}$$

In Equation 1, $P_{ch}$ is the power in the channel, $B_s$ is the specified bandwidth (also known as the channel bandwidth), $B_n$ is the equivalent noise bandwidth of the resolution bandwidth (RBW) used, N is the number of data points in the summation, $p_i$ is the sample of the power in measurement cell i in dB units (if $p_i$ is in dBm, $P_{ch}$ is in milliwatts). n1 and n2 are the end points for the index i within the channel bandwidth, thus N=(n2−n1)+1. See Agilent Spectrum Analyzer Measurements and Noise Application Note 1303, part number 5966-4008E, Feb. 11, 2003, available from Agilent Technologies, Inc., www.agilent.com.

Table 1 below sets out code that draws a band marker position at an appropriate screen position.

TABLE 1

```
/**
*@param horzXform conversion from x-axis units to pixels
*param vertXform conversion from dBm to pixels
* @param linear Scale
*              true if vertical scale is linear rather than logarithmic
* @param p    the painter which does the drawing
*/
void SADisplay::Marker::draw (    QwtDiMap& horzXform,
                                  QwtDiMap& vertXform,
                                  bool linearScale,
                                  Qpainter& p)
{
    if (myType != off)
    {
        p.save( );
        MarkerSymbol* m = 0;
        switch (selected)
        {
        case true:
            switch (myType)
            {
```

TABLE 1-continued

```
            case fixed:
                m = &selectedFixedMarker( );
                break;
            default:
                m = &selectedMoveableMarker( );
                break;
            }
            break;
        case false:
            switch(myType)
            {
            case fixed:
                m = &fixedMarker( );
                break;
            default:
                m = &moveableMarker( );
                break;
            }
            break;
        }
        // 5 is watts, 1 is dBm
        int myUnits = linearScale ? 5 : 1;
        double convertedY = AmplToInputUnits(myY, myUnits);
        int topLeftx = horzXform.transform(myX) - m → x;
        int topLefty = vertXform.transform(convertedY) - m → y;
        p.drawPixmap (topLeftx, topLefty, m → symbol);
        p.setPen(Qpen(Qt::white));
        //now draw wings if a band function is on
        if(drawWings)
        {
            p.drawPixmap(topLeftx + m → width/2 − 1,
                         topLefty + m → height/2 −1.
                         markerCenterDot ( ));
            //now compute line position
            int leftEnd = horzXform.transform(myX − myWidth/2.0);
            int rightEnd = horzXform.transform(myX + myWidth/2.0);
            int vertPosition = topLefty + m → height/2;
            p.drawLine(leftEnd, vertPosition, rightEnd, vertPosition);
            //now vertical ends
            int top;
            int bottom;
            if (selected)
            {
                //from top to bottom of window
                top = 0;
                bottom = 800; //big enough
            }
            else
            {
                top = vertPosition − 3;
                bottom = vertPosition + 3;
            }
            p.drawLine(leftEnd, top, leftEnd, bottom);
            p.drawLine(rightEnd, top, rightEnd, bottom);
        }
        if(selected)
        {
            p.setBackgroundColor(Qt::black);
            p.setBackgroundMode(Qt::OpaqueMode);
        }
        p.drawText(topLeftx + m → width,
                   topLefty + (myType == fixed ? m → height/2 +
                   10: m → myLabel.c_str( )));
        p.restore ( );
    }
}
```

Table 2 below sets out code that computes the absolute y value of the band marker when the band marker represents a band function. When the band marker represents a delta band function the code calculates the y value relative to the absolute value of its reference band marker.

TABLE 2

```
/**
 * @param force If true, compute the value even if the marker is Fixed
 */
void Sanity::MarkerNode::computeY(bool force)
{
    if(force || myMode != off && myMode != fixed)
    {
    // create local struct
    Sanity::BandFunction::Results lclresults;
        lclresults = bandCalcYFunction->calcY(myTrace,
                                              bandStartPoint,
                                              bandStopPoint);
        yVal = lclresults.yVal;
        yValForSymbol = lclresults.ySymbol;
        isyDefined = lclresults.isYDefined;
        if(myMode == delta)
        {
            // displayed and output value is difference
            //between reference markers absolute result, and this
            //markers absolute result
            yValForUI = yVal - relToVc →
            getValue<double>("Y-Value");
        }
        else
        {
            yValForUI = yVal;
        }
        if(isyDefined)
        {
            results → set("Y-Value", yVal);
            results → set("Y-ValueForUI", yValForUI);
            results → set("Y-ValueForSmbol", yValForSymbol);
        }
        results → set ("isY-ValueDefined", isyDefined);
        results → set ("isXFreq", freqDomain);
        #ifdef MARKERSPEW
        std::cout << "In MarkerNode::updateY( )"
            << "new absolute y position for marker" <<myNum
            << "is:" << yVal << std:: endl;
        if(myMode == delta)
        {
            std::cout << "In MarkerNode::updateY( )"
                << "new relative y position for marker "<< myNum
                << "is:" << yValForUI << std::endl;
        }
        #endif
    }
}
```

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A method for performing a function on a selected portion of a signal, comprising:
    marking a start frequency with a band marker;
    marking a stop frequency with the band marker;
    marking a center frequency located half way between the start frequency and the stop frequency, wherein the center frequency, the start frequency and the stop frequency are simultaneously marked by the band marker;
    performing a mathematical operation on a bandwidth of the signal between the start frequency and the stop frequency; and,
    displaying a numerical value representing a result of the mathematical operation, wherein the mathematical operation includes one of the following:
    calculating band power representing a total amount of power of the signal within the bandwidth of the signal between the start frequency and the stop frequency,
    calculating band power density representing a density of power of the signal within the bandwidth of the signal between the start frequency and the stop frequency.

2. A method as in claim 1:
    wherein the start frequency is marked with a left foot of the band marker, the left foot of the band marker being a vertical line; and,
    wherein the stop frequency is marked with a right foot of the band marker, the right foot of the band marker being a vertical line.

3. A method as in claim 1:
    wherein the start frequency is marked with a left foot of the band marker, the left foot of the band marker being a vertical line;
    wherein the stop frequency is marked with a right foot of the band marker, the right foot of the band marker being a vertical line; and,
    wherein the center frequency is indicated by a center diamond of the band marker.

4. A method for performing a function on a selected portion of a signal, comprising:
    marking a start frequency with a band marker;
    marking a stop frequency with the band marker;
    marking a center frequency located half way between the start frequency and the stop frequency, wherein the center frequency, the start frequency and the stop frequency are simultaneously marked by the band marker;
    marking a second start frequency with a second band marker;
    marking a second stop frequency with the second band marker; and,
    performing a delta band function on a second bandwidth of the signal between the second start frequency and the second stop frequency along with the bandwidth of the signal between the start frequency and the stop frequency, wherein the delta band function includes one of the following:
    delta band power,
    delta band power density.

5. A user interface for an electronic instrument, comprising:
    a display that displays a signal and a band marker, the band marker demarking a bandwidth of the signal by simultaneously marking a start frequency of the bandwidth, a stop frequency of the bandwidth and a center frequency of the bandwidth;
    wherein the electronic instrument performs a mathematical operation on the bandwidth of the signal between the start frequency and the stop frequency and displays a numerical value representing a result of the mathematical operation, the mathematical operation being one of the following:
    calculating band power representing a total amount of power of the signal within the bandwidth of the signal between the start frequency and the stop frequency,
    calculating band power density representing a density of power of the signal within the bandwidth of the signal between the start frequency and the stop frequency.

6. A user interface as in claim 5:
wherein the start frequency is marked with a left foot of the band marker, the left foot of the band marker being a vertical line; and,
wherein the stop frequency is marked with a right foot of the band marker, the right foot of the band marker being a vertical line.

7. A user interface as in claim 5:
wherein the start frequency is marked with a left foot of the band marker, the left foot of the band marker being a vertical line;
wherein the stop frequency is marked with a right foot of the band marker, the right foot of the band marker being a vertical line; and,
wherein the center frequency is indicated by a center diamond of the band marker.

8. A user interface for an electronic instrument, comprising:
a display that displays a signal and a band marker, the band marker demarking a bandwidth of the signal by simultaneously marking a start frequency of the bandwidth, a stop frequency of the bandwidth and a center frequency of the bandwidth;
wherein the electronic instrument performs a mathematical operation on the bandwidth of the signal between the start frequency and the stop frequency and displays a numerical value representing a result of the mathematical operation; and,
wherein the display additionally displays a second band marker, the second band marker demarking a second bandwidth of the signal by marking both a start frequency of the second bandwidth, and a stop frequency of the second bandwidth.

9. A user interface for an electronic instrument, comprising:
a display that displays a signal and a band marker, the band marker demarking a bandwidth of the signal by simultaneously marking a start frequency of the bandwidth, a stop frequency of the bandwidth and a center frequency of the bandwidth;
wherein the display additionally displays a second band marker, the second band marker demarking a second bandwidth of the signal by marking both a start frequency of the second bandwidth, and a stop frequency of the second bandwidth; and,
wherein the electronic instrument performs a delta function on the second bandwidth of the signal vis-à-vis the bandwidth of the signal between the start frequency and the stop frequency.

10. A user interface as in claim 9 wherein the delta band function includes one of the following:
delta band power;
delta band power density.

11. An electronic instrument, comprising:
an input means for receiving selections from a user; and,
a display means for displaying a signal and a band marker, the band marker demarking a bandwidth of the signal by simultaneously marking a start frequency of the bandwidth, a stop frequency of the bandwidth and a center frequency of the bandwidth;
wherein the electronic instrument performs a mathematical operation on the bandwidth of the signal between the start frequency and the stop frequency and displays a numerical value representing a result of the mathematical operation, the mathematical operation being one of the following:
calculation of band power representing a total amount of power of the signal within the bandwidth of the signal between the start frequency and the stop frequency,
calculation of band power density representing a density of power of the signal within the bandwidth of the signal between the start frequency and the stop frequency.

12. An electronic instrument as in claim 11:
wherein the start frequency is marked with a left foot of the band marker, the left foot of the band marker being a vertical line; and,
wherein the stop frequency is marked with a right foot of the band marker, the right foot of the band marker being a vertical line.

13. An electronic instrument as in claim 11:
wherein the start frequency is marked with a left foot of the band marker, the left foot of the band marker being a vertical line;
wherein the stop frequency is marked with a right foot of the band marker, the right foot of the band marker being a vertical line; and,
wherein the center frequency is indicated by a center diamond of the band marker.

14. An electronic instrument, comprising:
an input means for receiving selections from a user; and,
a display means for displaying a signal and a band marker, the band marker demarking a bandwidth of the signal by simultaneously marking a start frequency of the bandwidth, a stop frequency of the bandwidth and a center frequency of the bandwidth;
wherein the electronic instrument performs a mathematical operation on the bandwidth of the signal between the start frequency and the stop frequency and displays a numerical value representing a result of the mathematical operation; and,
wherein the display means is additionally for displaying a second band marker, the second band marker demarking a second bandwidth of the signal by marking both a start frequency of the second bandwidth, and a stop frequency of the second bandwidth.

15. An electronic instrument, comprising:
an input means for receiving selections from a user; and,
a display means for displaying a signal and a band marker, the band marker demarking a bandwidth of the signal by simultaneously marking a start frequency of the bandwidth, a stop frequency of the bandwidth and a center frequency of the bandwidth;
wherein the display means is additionally for displaying a second band marker, the second band marker demarking a second bandwidth of the signal by marking both a start frequency of the second bandwidth, and a stop frequency of the second bandwidth; and,
wherein the electronic instrument performs a delta function on the second bandwidth of the signal vis-à-vis the bandwidth of the signal between the start frequency and the stop frequency.

16. An electronic instrument as in claim 15 wherein the delta band function includes one of the following:
delta band power;
delta band power density.

* * * * *